US008404786B2

(12) United States Patent
Akiyama et al.

(10) Patent No.: US 8,404,786 B2
(45) Date of Patent: *Mar. 26, 2013

(54) POLYMER AND PROCESS FOR PRODUCING THE SAME, COMPOSITION FOR FORMING INSULATING FILM, AND INSULATING FILM AND METHOD OF FORMING THE SAME

(75) Inventors: Masahiro Akiyama, Tsukuba (JP);
Takahiko Kurosawa, Tsukuba (JP);
Hisashi Nakagawa, Tsukuba (JP);
Atsushi Shiota, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 363 days.

This patent is subject to a terminal disclaimer.

(21) Appl. No.: 12/717,225

(22) Filed: Mar. 4, 2010

(65) Prior Publication Data

US 2010/0168327 A1 Jul. 1, 2010

Related U.S. Application Data

(60) Division of application No. 11/489,468, filed on Jul. 20, 2006, now abandoned, which is a continuation of application No. PCT/JP2005/002343, filed on Feb. 16, 2005.

(30) Foreign Application Priority Data

Feb. 26, 2004 (JP) ................................ 2004-051733

(51) Int. Cl.
*C08G 77/60* (2006.01)
(52) U.S. Cl. ............. 525/477; 528/14; 528/35; 427/387
(58) Field of Classification Search .................. None
See application file for complete search history.

(56) References Cited

U.S. PATENT DOCUMENTS

| | | | |
|---|---|---|---|
| 3,980,729 A | 9/1976 | Yokokawa et al. | |
| 4,220,600 A | 9/1980 | Yajima et al. | |
| 6,251,313 B1 | 6/2001 | Deubzer et al. | |
| 6,809,041 B2 | 10/2004 | Interrante et al. | |
| 7,108,922 B2 * | 9/2006 | Lyu et al. | 428/447 |
| 7,291,567 B2 | 11/2007 | Tsuchiya et al. | |
| 7,358,299 B2 * | 4/2008 | Nakata et al. | 524/588 |
| 7,399,715 B2 | 7/2008 | Tsuchiya et al. | |
| 7,462,678 B2 | 12/2008 | Akiyama et al. | |
| 7,514,151 B2 | 4/2009 | Shiota | |
| 7,528,207 B2 | 5/2009 | Nakagawa et al. | |
| 7,736,748 B2 * | 6/2010 | Akiyama et al. | 428/447 |
| 7,875,317 B2 * | 1/2011 | Nakagawa et al. | 427/387 |
| 2001/0033026 A1 * | 10/2001 | Nakata et al. | 257/759 |
| 2003/0207131 A1 * | 11/2003 | Nakata et al. | 428/447 |
| 2004/0000715 A1 | 1/2004 | Interrante et al. | |
| 2004/0007753 A1 * | 1/2004 | Seki et al. | 257/443 |
| 2005/0096415 A1 | 5/2005 | Akiyama et al. | |
| 2006/0006541 A1 | 1/2006 | Tsuchiya et al. | |
| 2006/0024980 A1 | 2/2006 | Tsuchiya et al. | |
| 2006/0210812 A1 | 9/2006 | Shiota | |
| 2007/0015892 A1 | 1/2007 | Nakagawa et al. | |
| 2007/0020467 A1 | 1/2007 | Nakagawa et al. | |
| 2007/0027287 A1 | 2/2007 | Akiyama et al. | |
| 2007/0031687 A1 | 2/2007 | Akiyama et al. | |
| 2008/0038527 A1 | 2/2008 | Akiyama et al. | |
| 2008/0246153 A1 | 10/2008 | Tsuchiya et al. | |
| 2008/0268264 A1 | 10/2008 | Akiyama et al. | |
| 2009/0281237 A1 | 11/2009 | Nakagawa et al. | |
| 2009/0299086 A1 | 12/2009 | Nobe et al. | |
| 2010/0007025 A1 | 1/2010 | Nakagawa et al. | |

FOREIGN PATENT DOCUMENTS

| | | |
|---|---|---|
| EP | 1 705 208 A1 | 9/2006 |
| JP | 54-61299 | 5/1979 |
| JP | 4-100873 | 4/1992 |
| JP | 5-105759 | 4/1993 |
| JP | 2000-309752 | 11/2000 |
| JP | 2001-127152 | 5/2001 |
| JP | 2001-345317 | 12/2001 |
| JP | 2003-115482 | 4/2003 |
| JP | 2005-76031 | 3/2005 |
| WO | WO 02/098955 A1 | 12/2002 |

OTHER PUBLICATIONS

"Starfire® SP-DEPCSs", Starfire® Systems, www.starfiresystems.com, 1 page (May 2005).
"Starfire® SP-DMPCS", Starfire® Systems, www.starfiresystems.com, 1 page (May 2005).
"Specialty Chemicals", Starfire Systems, (1), 1 page.
"Specialty Chemicals", Starfire Systems, (2), 1 page.
"Internet Archive WayBack Machine", http://web.archive.org/web/*/http://www.starfiresystems.com, 1 page.
"Starfire Systems: Projects, Specialty Chemicals", http://web.archive.org/web/20011205120755/www.starfiresystems.com/projects/chemicals.html, pp. 1-2.
U.S. Appl. No. 12/934,806, filed Sep. 27, 2010, Nakagawa, et al.

* cited by examiner

*Primary Examiner* — Marc Zimmer
(74) *Attorney, Agent, or Firm* — Oblon, Spivak, McClelland, Maier & Neustadt, L.L.P.

(57) ABSTRACT

A process for producing a polymer includes mixing (A) a polysiloxane compound and (B) a polycarbosilane compound in the presence of a catalyst, water, and an organic solvent, and heating the mixture.

17 Claims, No Drawings

POLYMER AND PROCESS FOR PRODUCING THE SAME, COMPOSITION FOR FORMING INSULATING FILM, AND INSULATING FILM AND METHOD OF FORMING THE SAME

CROSS REFERENCE TO RELATED APPLICATION

This is a divisional application of U.S. application Ser. No. 11/489,468, filed Jul. 20, 2006, which is a continuation of International Patent Application No. PCT/JP2005/002343, having an international filing date of Feb. 16, 2005, which designated the United States, the entirety of which is incorporated herein by reference. Japanese Patent Application No. 2004-051733, filed on Feb. 26, 2004, is also incorporated herein by reference in its entirety.

BACKGROUND OF THE INVENTION

The present invention relates to a process for producing a polymer. More particularly, the invention relates to a polymer suitably used for an interlayer dielectric for semiconductor devices and the like, a process for producing the same, an insulating-film-forming composition, an insulating film, and a method of forming the same.

A silica ($SiO_2$) film formed by a vacuum process such as chemical vapor deposition (CVD) has been widely used as an interlayer dielectric for semiconductor devices and the like. In recent years, a coating-type insulating film called a spin-on-glass (SOG) film, which contains a tetraalkoxysilane hydrolyzate as the major component, has also been used in order to form an interlayer dielectric with a more uniform thickness. Along with an increase in the degree of integration of semiconductor devices, a low-relative-dielectric-constant interlayer dielectric called an organic SOG film, which contains a polyorganosiloxane as the major component, has been developed.

Since the degree of integration and the number of layers of semiconductor devices have been further increased, an improved electrical insulation between conductors has been demanded. Therefore, an interlayer dielectric exhibiting excellent storage stability, a lower relative dielectric constant, and excellent leakage current characteristics has been in demand.

JP-A-2001-127152 proposes a method which includes preparing a coating liquid by mixing a polycarbosilane solution and a polysiloxane solution and forming a low-dielectric-constant insulating film using the resulting coating liquid. However, this method has a problem in which the carbosilane domains and the siloxane domains are nonuniformly dispersed in the resulting coating. A semiconductor device manufacturing process involves a chemical mechanical planarization (CMP) step for planarizing an insulating layer and various cleaning (washing) steps. Therefore, a material used for an interlayer dielectric or a protective film for semiconductor devices is required to exhibit mechanical strength and chemical resistance against chemical corrosion in addition to the dielectric constant characteristics.

SUMMARY

An object of the invention is to provide a polymer which may be suitably used for semiconductor devices and the like for which an increase in the degree of integration and the number of layers has been demanded and may form an insulating film exhibiting a low relative dielectric constant and excellent chemical resistance, and a process for producing the same.

Another object of the invention is to provide an insulating-film-forming composition using the polymer according to the invention, a method of forming an insulating film, and an insulating film.

A process for producing a polymer according to one aspect of the invention comprises mixing (A) a polysiloxane compound and (B) a polycarbosilane compound in the presence of a catalyst, water, and an organic solvent, and heating the mixture.

In this process for producing a polymer, the polycarbosilane compound (B) may be a polycarbosilane compound having a structure of the following general formula (1),

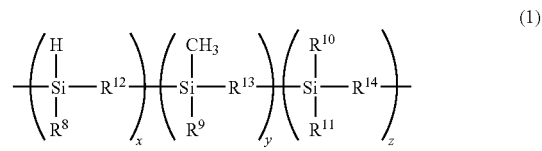

wherein, $R^8$ represents a group selected from the group consisting of a hydrogen atom, a halogen atom, a hydroxyl group, an alkoxy group, an acyloxyl group, a sulfone group, a methanesulfone group, a trifluoromethanesulfone group, an alkyl group, an alkenyl group, and an aryl group, $R^9$ represents a group selected from the group consisting of a halogen atom, a hydroxyl group, an alkoxy group, an acyloxyl group, a sulfone group, a methanesulfone group, a trifluoromethanesulfone group, an alkyl group, an alkenyl group, and an aryl group, $R^{10}$ and $R^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an alkenyl group, and an aryl group, $R^{12}$ to $R^{14}$ individually represent a substituted or unsubstituted methylene group, a substituted or unsubstituted alkylene group, a substituted or unsubstituted alkenylene group, or a substituted or unsubstituted arylene group, and x, y, and z individually represent integers from 0 to 10,000 which satisfy "5<x+y+z<10,000", provided that, when "x=0", one of $R^9$, $R^{10}$, and $R^{11}$ is a hydrogen atom, a hydroxyl group, an alkoxy group, an acyloxyl group, a sulfone group, a methanesulfone group, or a trifluoromethanesulfone group.

In this process for producing a polymer, the component (A) may be obtained by hydrolyzing and condensing a hydrolyzable-group-containing silane compound, and the component (B) may be used in an amount of 1 to 1,000 parts by weight for 100 parts by weight of the component (A) as a complete hydrolysis-condensation product.

In this process for producing a polymer, the component (B) may have a polystyrene-reduced weight average molecular weight of 400 to 50,000.

In this process for producing a polymer, the catalyst may be an acid catalyst, a base catalyst, or a metal catalyst.

In this process for producing a polymer, the catalyst may be used in an amount of 0.001 to 100 parts by weight for 100 parts by weight of the component (A) and the component (B) in total.

In this process for producing a polymer, the water may be used in an amount of 0.1 to 100 parts by weight for 100 parts by weight of the component (A) and the component (B) in total.

According to the above-described process for producing a polymer, a polymer in which the polysiloxane and the polycarbosilane are reacted can be obtained by mixing the polysiloxane compound (A) and the polycarbosilane compound (B) in the presence of the catalyst, water, and organic solvent and heating the mixture. The resulting polymer does not undergo phase separation, which may occur when blending a polysiloxane solution and a polycarbosilane solution. A polymer film which exhibits a low relative dielectric constant and excellent chemical resistance can be obtained by using an insulating-film-forming composition including such a specific polymer.

A polymer according to one aspect of the invention is obtained by the above-described process for producing a polymer.

A polymer-film-forming composition according to one aspect of the invention includes the above-described polymer and an organic solvent.

A method of forming a polymer film according to one aspect of the invention may include applying the insulating-film-forming composition to a substrate, and heating the applied composition at 30 to 500° C.

An insulating film according to one aspect of the invention is obtained by the method of forming an insulating film.

The above-described insulating film exhibits a low relative dielectric constant and excellent chemical resistance, as described above. Therefore, the insulating film may be suitably used as an interlayer dielectric for semiconductor devices.

DETAILED DESCRIPTION OF THE EMBODIMENT

The polymer, the process for producing the same, the insulating-film-forming composition, the insulating film, and the method of forming the same according to some embodiments of the invention are described below in detail.

1. PROCESS FOR PRODUCING POLYMER

The process for producing a polymer according to one embodiment of the invention includes mixing the polysiloxane compound (A) (hereinafter may be called "component (A)") and the polycarbosilane compound (B) (hereinafter may be called "component (B)") in the presence of a catalyst, water, and an organic solvent, and heating the mixture.

According to the process for producing a polymer according to this embodiment, when the polysiloxane compound (A) and the polycarbosilane compound (B) respectively include an Si—OH group, the Si—OH group in the polycarbosilane compound (B) and the Si—OH group in the polysiloxane compound (A) are condensed by mixing the polysiloxane compound (A) and the polycarbosilane compound (B) in the presence of a catalyst, water, and an organic solvent and heating the mixture, whereby formation of a polysiloxane-polycarbosilane composite structure progresses. This produces a polymer which does not undergo phase separation.

When the polycarbosilane compound (B) does not include an Si—OH group, if the polycarbosilane compound (B) includes an Si—H group or a functional group which produces an Si—OH group by hydrolysis, an Si—OH group can be introduced into the polycarbosilane compound (B) by mixing the polysiloxane compound (A) and the polycarbosilane compound (B) in the presence of a catalyst, water, and an organic solvent and heating the mixture. This allows condensation to occur between the Si—OH group in the polycarbosilane compound (B) and the Si—OH group in the polysiloxane compound (A), whereby formation of a polysiloxane-polycarbosilane composite structure progresses.

1.1. Polysiloxane Compound (A)

In this process for producing a polymer, the polysiloxane compound (A) may be a compound obtained by hydrolyzing and condensing a hydrolyzable-group-containing silane compound. The term "hydrolyzable group" used herein refers to a group which may be hydrolyzed. Specific examples of the hydrolyzable group include a hydrogen atom bonded to a silicon atom, a halogen atom, a hydroxyl group, alkoxy group, acyloxy group, sulfone group, methanesulfone group, and trifluoromethanesulfone group. Note that the hydrolyzable group is not limited to these groups.

As the polysiloxane compound (A), a polysiloxane compound may be used which is obtained by hydrolyzing and condensing at least one silane compound selected from the group consisting of a compound of the following general formula (2) (hereinafter called "compound 2"), a compound of the following general formula (3) (hereinafter called "compound 3"), and a compound of the following general formula (4) (hereinafter called "compound 4"),

$$R_a Si(OR^1)_{4-a} \quad (2)$$

wherein R represents a hydrogen atom, a fluorine atom, or a monovalent organic group, $R^1$ represents a monovalent organic group, and a represents an integer from 1 to 3,

$$Si(OR^2)_4 \quad (3)$$

wherein $R^2$ represents a monovalent organic group,

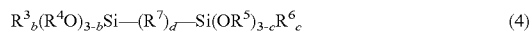

$$R^3{}_b(R^4O)_{3-b}Si-(R^7)_d-Si(OR^5)_{3-c}R^6{}_c \quad (4)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

1.1.1. Compound 2

As examples of the monovalent organic group represented by R and $R^1$ in the general formula (2), an alkyl group, alkenyl group, aryl group, and the like can be given. It is preferable that the monovalent organic group represented by $R^1$ in the general formula (2) be an alkyl group, alkenyl group, or phenyl group. As examples of the alkyl group, a methyl group, ethyl group, propyl group, butyl group, and the like can be given. The alkyl group preferably has 1 to 5 carbon atoms. These alkyl groups may be either linear or branched, in which a hydrogen atom may be replaced with a fluorine atom or the like. As examples of the alkenyl group in the general formula (2), a vinyl group, allyl group, and the like can be given. As examples of the aryl group in the general formula (2), a phenyl group, naphthyl group, methylphenyl group, ethylphenyl group, chlorophenyl group, bromophenyl group, fluorophenyl group, and the like can be given.

As specific examples of the compound 2, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyliso-triethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, vinyltri-n-propoxysilane, vinyltri-isopropoxysilane, vinyltri-n-butoxysilane, vinyltri-sec-butoxysilane, vinyltri-tert-butoxysilane, vinyltriphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldiisopropoxysilane, di-sec-butyldibutyldi-n-butoxysilane, di-sec-butyldi-sec-butoxysilane, di-sec-butyldi-tert-butoxy silane, di-sec-butyldi-phenoxysilane, di-tert-butyldimethoxysilane, di-tert-butyldi-ethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldi-ethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyldimethoxysilane, and the like can be given. These compounds may be used either individually or in combination of two or more.

Of these, methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, and the like are preferable as the compound 2.

1.1.2. Compound 3

As examples of the monovalent organic group represented by $R^2$ in the general formula (3), the monovalent organic groups illustrated for the general formula (2) can be given.

As specific examples of the compound 3, tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like can be given. Of these, tetramethoxysilane and tetraethoxysilane are preferable. These compounds may be used either individually or in combination of two or more.

1.1.3. Compound 4

As examples of the monovalent organic group represented by $R^3$ to $R^6$ in the general formula (4), the monovalent organic groups illustrated for the general formula (2) can be given.

As examples of the compound of the general formula (4) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compound of the general formula (4) in which $R^7$ is the group —$(CH_2)_m$—, bis(trimethoxysilyl)methane, bis(triethoxysilyl)methane, bis(tri-n-propoxysilyl)methane, bis(tri-iso-propoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-iso-propoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(trin-propoxysilyl)methane, 1-(di-iso-propoxymethylsilyl)-1-(tri-iso-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-iso-propoxymethylsilyl)-2-(tri-iso-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(di-iso-propoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-iso-propoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like can be given.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

The compounds 2 to 4 may be used either individually or in combination of two or more.

When subjecting the compounds 2 to 4 to hydrolysis and partial condensation, it is preferable to use water in an amount of 0.3 to 10 mol for one mole of the groups represented by $R^1O—$, $R^2O—$, $R^4O—$, and $R^5O—$ in the general formulas (2) to (4). When hydrolyzing and condensing the compounds 1 to 3, a solution obtained by dissolving these compounds in an organic solvent may be used. As the organic solvent, an organic solvent given in "1.3. Organic solvent" described later may be used.

In this embodiment, the polystyrene-reduced weight average molecular weight of the polysiloxane compound is preferably 100 to 100,000, and still more preferably 1,000 to 100,000. The term "complete hydrolysis-condensation product" used herein refers to a product in which the groups represented by $R^1O—$, $R^2O—$, $R^4O—$, and $R^5O—$ in the siloxane compounds are completely hydrolyzed to form OH groups and are completely condensed.

1.1.4. Catalyst

In the process for producing a polymer according to this embodiment of the invention, a catalyst may be used when producing the polysiloxane compound, if necessary. As examples of the catalyst, an organic acid, inorganic acid, organic base, inorganic base, metal chelate, and the like can be given.

As examples of the organic acid, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, phthalic acid, fumaric acid, citric acid, tartaric acid, and the like can be given.

As examples of the inorganic acid, hydrochloric acid, nitric acid, sulfuric acid, hydrofluoric acid, phosphoric acid, and the like can be given. As examples of the inorganic base, ammonia, sodium hydroxide, potassium hydroxide, barium hydroxide, calcium hydroxide, and the like can be given.

As examples of the organic base, methanolamine, ethanolamine, propanolamine, butanolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmetanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanoleamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, and the like can be given.

As examples of the metal chelate, titanium chelate compounds such as triethoxy•mono(acetylacetonato)titanium, tri-n-propoxy•mono(acetylacetonato)titanium, tri-i-propoxy•mono(acetylacetonato)titanium, tri-n-butoxy•mono(acetylacetonato)titanium, tri-sec-butoxy•mono(acetylacetonato)titanium, tri-t-butoxy•mono(acetylacetonato)titanium, diethoxy•bis(acetylacetonato)titanium, di-n-propoxy•bis(acetylacetonato)titanium, di-i-propoxy•bis(acetylacetonato)titanium, di-n-butoxy•bis(acetylacetonato)titanium, di-sec-butoxy•bis(acetylacetonato)titanium, di-t-butoxy•bis(acetylacetonato)titanium, monoethoxy•tris(acetylacetonato)titanium, mono-n-propoxy•tris(acetylacetonato)titanium, mono-i-propoxy•tris(acetylacetonato)titanium, mono-n-butoxy•tris(acetylacetonato)titanium, mono-sec-butoxy•tris(acetylacetonato)titanium, mono-t-butoxy•tris(acetylacetonato)titanium, tetrakis(acetylacetonato)titanium, triethoxy•mono(ethyl acetoacetate)titanium, tri-n-propoxy•mono(ethyl acetoacetate)titanium, tri-i-propoxy•mono(ethyl acetoacetate)titanium, tri-n-butoxy•mono(ethyl acetoacetate)titanium, tri-sec-butoxy•mono(ethyl acetoacetate)titanium, tri-t-butoxy•mono (ethyl acetoacetate)titanium, diethoxy•bis(ethyl acetoacetate)titanium, di-n-propoxy•bis(ethyl acetoacetate)titanium, di-i-propoxy•bis(ethyl acetoacetate)titanium, di-n-butoxy•bis(ethyl acetoacetate)titanium, di-sec-butoxy•bis (ethyl acetoacetate)titanium, di-t-butoxy•bis(ethyl acetoacetate)titanium, monoethoxy•tris(ethyl acetoacetate) titanium, mono-n-propoxy•tris(ethyl acetoacetate)titanium, mono-i-propoxy•tris(ethyl acetoacetate)titanium, mono-n-butoxy•tris(ethyl acetoacetate)titanium, mono-sec-butoxy•tris(ethyl acetoacetate)titanium, mono-t-butoxy•tris (ethyl acetoacetate)titanium, tetrakis(ethyl acetoacetate) titanium, mono(acetylacetonato)tris(ethyl acetoacetate) titanium, bis(acetylacetonato)bis(ethyl acetoacetate) titanium, and tris(acetylacetonato)mono(ethyl acetoacetate) titanium; zirconium chelate compounds such as triethoxy•mono(acetylacetonato)zirconium, tri-n-propoxy•mono(acetylacetonato)zirconium, tri-i-propoxy•mono(acetylacetonato)zirconium, tri-n-butoxy•mono(acetylacetonato)zirconium, tri-sec-butoxy•mono(acetylacetonato)zirconium, tri-t-butoxy•mono (acetylacetonato)zirconium, diethoxy•bis(acetylacetonato) zirconium, di-n-propoxy•bis(acetylacetonato)zirconium, di-i-propoxy•bis(acetylacetonato)zirconium, di-n-butoxy•bis(acetylacetonato)zirconium, di-sec-butoxy•bis (acetylacetonato)zirconium, di-t-butoxy•bis(acetylacetonato)zirconium, monoethoxy•tris(acetylacetonato) zirconium, mono-n-propoxy•tris(acetylacetonato) zirconium, mono-i-propoxy•tris(acetylacetonato)zirconium, mono-n-butoxy•tris(acetylacetonato)zirconium, mono-sec-butoxy•tris(acetylacetonato)zirconium, mono-t-butoxy•tris (acetylacetonato)zirconium, tetrakis(acetylacetonato)zirconium, triethoxy•mono(ethyl acetoacetate)zirconium, tri-n-propoxy•mono(ethyl acetoacetate)zirconium, tri-i-propoxy•mono(ethyl acetoacetate)zirconium, tri-n-butoxy•mono(ethyl acetoacetate)zirconium, tri-sec-butoxy•mono(ethyl acetoacetate)zirconium, tri-t-butoxy•mono(ethyl acetoacetate)zirconium, diethoxy•bis (ethyl acetoacetate)zirconium, di-n-propoxy•bis(ethyl acetoacetate)zirconium, di-i-propoxy•bis(ethyl acetoacetate) zirconium, di-n-butoxy•bis(ethyl acetoacetate)zirconium, di-sec-butoxy•bis(ethyl acetoacetate)zirconium, di-t-butoxy•bis(ethyl acetoacetate)zirconium, monoethoxy•tris (ethyl acetoacetate)zirconium, mono-n-propoxy•tris(ethyl acetoacetate)zirconium, mono-i-propoxy•tris(ethyl acetoacetate)zirconium, mono-n-butoxy•tris(ethyl acetoacetate)zirconium, mono-sec-butoxy•tris(ethyl acetoacetate)zirconium, mono-t-butoxy•tris(ethyl acetoacetate)zirconium, tetrakis (ethyl acetoacetate)zirconium, mono(acetylacetonato)tris (ethyl acetoacetate)zirconium, bis(acetylacetonato)bis(ethyl acetoacetate)zirconium, and tris(acetylacetonato)mono (ethyl acetoacetate)zirconium; aluminum chelate compounds such as tris(acetylacetonato)aluminum and tris(ethyl acetoacetate)aluminum; and the like can be given.

The catalyst is used in an amount of usually 0.0001 to 1 mol, and preferably 0.001 to 0.1 mol for one mol of the compounds 2 to 4 in total.

1.2. Polycarbosilane Compound (B)

In the process for producing a polymer according to this embodiment of the invention, a polycarbosilane compound having a structure of the following general formula (1) (hereinafter called "compound 1") may be used as the polycarbosilane compound (B),

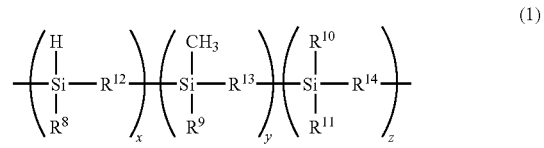

(1)

wherein $R^8$ represents a group selected from the group consisting of a hydrogen atom, a halogen atom, a hydroxyl group, an alkoxy group, an acyloxyl group, a sulfone group, a methanesulfone group, a trifluoromethanesulfone group, an alkyl group, an alkenyl group, and an aryl group, $R^9$ represents a group selected from the group consisting of a halogen atom, a hydroxyl group, an alkoxy group, an acyloxyl group, a sulfone group, a methanesulfone group, a trifluoromethanesulfone group, an alkyl group, an alkenyl group, and an aryl group, and $R^{10}$ and $R^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an alkenyl group, and an aryl group. $R^8$ to $R^{11}$ may be either the same or different groups.

In the general formula (1), $R^{12}$ to $R^{14}$ individually represent a substituted or unsubstituted methylene group, a substituted or unsubstituted alkylene group, a substituted or unsubstituted alkenylene group, or a substituted or unsubstituted arylene group. As examples of the alkylene group, a methylene group, ethylene group, propylene group, butylene group, hexylene group, decylene group, and the like can be given. The alkylene group preferably has 1 to 6 carbon atoms. The alkylene group may be either linear, branched, or cyclic. A hydrogen atom in the alkylene group may be replaced with a fluorine atom or the like. As examples of the alkenylene group, an ethenylene group, propenylene group, 1-butenylene group, 2-butenylene group, and the like can be given. The alkenylene group may be a dienylene group. The alkenylene group preferably has 1 to 4 carbon atoms. A hydrogen atom in the alkenylene group may be replaced with a fluorine atom or the like. As examples of the arylene group, a phenylene group, naphthylene group, and the like can be given. A hydrogen atom in the arylene group may be replaced with a fluorine atom or the like.

In the general formula (1), x, y, and z individually represent integers from 0 to 10,000 which satisfy "5<x+y+z<10,000". If "x+y+z" is less than 5, the resulting insulating-film-forming composition may exhibit inferior storage stability. If "x+y+z" is greater than 10,000, the component (B) may be separated from the component (A), whereby a uniform film may not be formed. It is preferable that x, y, and z be respectively "0≦x≦800", "0≦y≦500", and "0≦z≦1,000", more preferably "0≦x≦500", "0≦y≦300", and "0≦z≦500", and still more preferably "0≦x≦100", "0≦y≦50", and "0≦z≦100".

In the general formula (1), it is preferable that x, y, and z satisfy "5<x+y+z<1,000", more preferably "5<x+y+z<500", still more preferably "5<x+y+z<250", and most preferably "5<x+y+z<100".

When "x=0", one of $R^9$, $R^{10}$, and $R^{11}$ is a hydrogen atom, a hydroxyl group, an alkoxy group, an acyloxyl group, a sulfone group, a methanesulfone group, or a trifluoromethanesulfone group. This allows the component (B) to include an Si—OH group or a functional group which produces an Si—OH group by hydrolysis, and allows the Si—OH group or the functional group to be condensed with the Si—OH group in the component (A), whereby formation of a composite structure progresses.

In the insulating-film-forming composition according to one embodiment of the invention, the component (B) may have a polystyrene-reduced weight average molecular weight of 400 to 50,000.

In the insulating-film-forming composition, when the component (A) is a compound obtained by hydrolyzing and condensing a hydrolyzable-group-containing silane compound, the component (B) may be used in an amount of 1 to 1,000 parts by weight for 100 parts by weight of the component (A) as a complete hydrolysis-condensation product.

The polycarbosilane compound (B) may further include the following structural units (5) to (7),

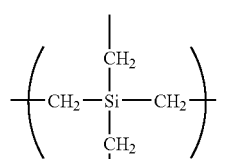

(5)

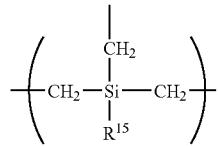

(6)

wherein $R^{15}$ represents a group selected from the group consisting of a hydrogen atom, a halogen atom, a hydroxyl group, an alkoxy group, an acyloxyl group, a sulfone group, a methanesulfone group, and a trifluoromethanesulfone group,

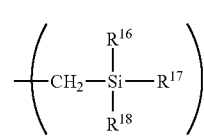

(7)

wherein $R^{16}$ to $R^{18}$ individually represent groups similar to $R^{15}$.

When the component (B) includes the above structural units (5) to (7), the molecules of the component (B) preferably include the structural unit (5) in an amount of 5 to 20 mol % (still more preferably 10 to 15 mol %), the structural unit (6) in an amount of 1 to 15 mol % (still more preferably 5 to 10 mol %), and the structural unit (7) in an amount of 30 to 50 mol % (still more preferably 35 to 45 mol %).

The number of silicon atoms in the component (B) is preferably 5 to 200, more preferably 5 to 50, and still more preferably 5 to 15.

The ratio of the structural units and the number of silicon atoms in the component (B) may be estimated from $^{29}$Si-NMR spectrum analysis results and the polystyrene-reduced weight average molecular weight, for example.

1.3. Organic Solvent

In the process for producing a polymer according to one embodiment of the invention, the polysiloxane compound (A) described in "1.1. Polysiloxane compound" and the polycarbosilane compound (B) described in "1.2. Polycarbosilane compound" are used in a state in which these compounds are dissolved or dispersed in an organic solvent. The total concentration of the component (A) and the component (B) in the organic solvent is preferably 1 to 30 wt %.

As the organic solvent which may be used in the process for producing a polymer, at least one solvent selected from the group consisting of an alcohol solvent, ketone solvent, amide solvent, ether solvent, ester solvent, aliphatic hydrocarbon solvent, aromatic solvent, and halogen-containing solvent may be used.

As examples of the alcohol solvent, monohydric alcohols such as methanol, ethanol, n-propanol, iso-propanol, n-butanol, iso-butanol, sec-butanol, t-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-polyethylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like can be given.

These alcohol solvents may be used either individually or in combination of two or more.

As examples of the ketone solvent, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like can be given.

These ketone solvents may be used either individually or in combination of two or more.

As examples of the amide solvent, nitrogen-containing solvents such as N,N-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like can be given.

These amide solvents may be used either individually or in combination of two or more.

As examples of the ether solvent, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like can be given. These ether solvents may be used either individually or in combination of two or more.

These ether solvents may be used either individually or in combination of two or more.

As examples of the ester solvent, diethyl carbonate, propylene carbonate, methyl acetate, ethyl acetate, gamma-butyrolactone, gamma-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given.

These ester solvents may be used either individually or in combination of two or more.

As examples of the aliphatic hydrocarbon solvent, n-pentane, i-pentane, n-hexane, i-hexane, n-heptane, i-heptane, 2,2,4-trimethylpentane, n-octane, i-octane, cyclohexane, methylcyclohexane, and the like can be given.

These aliphatic hydrocarbon solvents may be used either individually or in combination of two or more.

As examples of the aromatic hydrocarbon solvent, benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, trimethylbenzene, and the like can be given.

These aromatic hydrocarbon solvents may be used either individually or in combination of two or more.

As examples of the halogen-containing solvent, dichloromethane, chloroform, fluorocarbon, chlorobenzene, dichlorobenzene, and the like can be given.

In this embodiment, it is preferable to use an organic solvent having a boiling point of less than 250° C. The organic solvent is preferably the ketone solvent, ester solvent, or aromatic hydrocarbon solvent. It is preferable to use one or more of these solvents.

1.4. Catalyst

In the process for producing a polymer according to one embodiment of the invention, a catalyst may be used. As examples of the catalyst, the catalysts described in "1.1.4. Catalyst", which may be used when producing the polysiloxane compound (A), can be given.

In the process for producing a polymer, the catalyst is used in an amount of preferably 0.001 to 100 parts by weight, more preferably 0.005 to 50 parts by weight, and still more preferably 0.01 to 10 parts by weight for 100 parts by weight of the component (A) and the component (B) in total. If the amount of the catalyst is less than 0.001 parts by weight, the component (A) and the component (B) may not sufficiently form a composite structure, whereby the resulting coating may undergo phase separation. If the amount of the catalyst exceeds 100 parts by weight, the component (A) and the component (B) may rapidly undergo a composite structure formation reaction, whereby gelation may occur.

1.5. Water

In the process for producing a polymer, water is used in an amount of preferably 0.1 to 100 parts by weight, more preferably 0.1 to 50 parts by weight, and still more preferably 1 to 20 parts by weight for 100 parts by weight of the component (A) and the component (B) in total. When water is used in an amount of 0.1 to 100 parts by weight, a film exhibiting improved chemical resistance while maintaining a low relative dielectric constant can be obtained.

1.6. Composition

In the process for producing a polymer, the component (B) is used in an amount of preferably 1 to 1,000 parts by weight, and still more preferably 5 to 50 parts by weight for 100 parts by weight of the component (A) as a complete hydrolysis-condensation product. A film exhibiting improved chemical resistance while maintaining a low relative dielectric constant can be obtained by using the component (B) in an amount in the above range with respect to the component (A).

2. INSULATING-FILM-FORMING COMPOSITION

In the insulating-film-forming composition according to one embodiment of the invention, an organic polymer, a surfactant, and the like may be added to the liquid material obtained by the process described in "1. Process for producing polymer", in which the polymer is dissolved or dispersed in the organic solvent.

An organic solvent may be further added to the above liquid material. As examples of the organic solvent, the organic solvents described in "1.3. Organic solvent" can be given. The organic solvent to be added may be the same as the organic solvent used in the above-described process for producing a polymer. Or, the organic solvent used to produce the polymer may be replaced with a desired organic solvent, or a desired organic solvent may be added to the organic solvent used to produce the polymer after producing the polymer.

2.1. Organic Polymer

As examples of the organic polymer, a polymer having a sugar chain structure, vinyl amide polymer, (meth)acrylic polymer, aromatic vinyl compound polymer, dendrimer, polyimide, polyamic acid, polyarylene, polyamide, polyquinoxaline, polyoxadizole, fluorine-containing polymer, polymer having a polyalkylene oxide structure, and the like can be given.

As the polyalkylene oxide structure, a polymethylene oxide structure, polyethylene oxide structure, polypropylene oxide structure, polytetramethylene oxide structure, polybutylene oxide structure, and the like can be given.

As specific examples of the compound having a polyalkylene oxide structure, ether compounds such as polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; and ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester, and the like can be given.

As a polyoxyethylene polyoxypropylene block copolymer, compounds having the following block structure can be given.

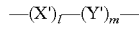

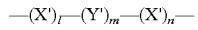

wherein X' represents a group —CH$_2$CH$_2$O—, Y' represents a group —CH$_2$CH(CH$_3$)O—, l represents an integer from 1 to 90, m represents an integer from 10 to 99, and n represents an integer from 0 to 90.

Of these, the ether compounds such as a polyoxyethylene alkyl ether, polyoxyethylene-polyoxypropylene block copolymer, polyoxyethylene polyoxypropylene alkyl ether, polyoxyethylene glyceride, polyoxyethylene sorbitan fatty acid ester, and polyoxyethylene sorbitol fatty acid ester are preferable.

These organic polymers may be used either individually or in combination of two or more.

2.2. Surfactant

As examples of the surfactant, a nonionic surfactant, an anionic surfactant, a cationic surfactant, an amphoteric surfactant, and the like can be given. Specific examples include a fluorine-containing surfactant, a silicone surfactant, a polyalkylene oxide surfactant, a poly(meth)acrylate surfactant, and the like. Of these, the fluorine-containing surfactant and the silicone surfactant are preferable.

As examples of the fluorine-containing surfactant, compounds in which at least the terminal, main chain, or side chain includes a fluoroalkyl or fluoroalkylene group, such as 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol(1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-3-(perfluorooctanesulfonamide)-propyl-N,N'-dimethyl-N-carboxymethylene ammonium betaine, perfluoroalkylsulfonamide propyltrimethyl ammonium salt, perfluoroalkyl-N-ethylsulfonylglycine salt, bis(N-perfluorooctylsulfonyl-N-ethylaminoethyl) phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Shin-Akita Kasei Co., Ltd.). Fluorad FC-430, FC-431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), NBX-15 (manufactured by NEOS Co., Ltd.), and the like can be given. Of these, Megafac F172, BM-1000, BM-1100, and NBX-15 are preferable.

As the silicone surfactant, SH7PA, SH21PA, SH28PA, SH30PA, ST94PA (manufactured by Toray-Dow Corning Silicone Co., Ltd.) and the like may be used. Of these, SH28PA and SH30PA are preferable.

The surfactant is used in an amount of usually 0.00001 to 1 part by weight for 100 parts by weight of the polymer formed of the component (A) and the component (B).

These surfactants may be used either individually or in combination of two or more.

3. METHOD OF FORMING INSULATING FILM

The insulating film according to one embodiment of the invention may be obtained by applying the insulating-film-forming composition described in "2. Insulating-film-forming composition" to a substrate to form a coating, and heating the coating and/or applying high energy rays to the coating.

When applying the insulating-film-forming composition to a substrate such as a silicon wafer, SiO$_2$ wafer, or SiN wafer, the insulating-film-forming composition is applied by spin coating, dip coating, roll coating, spraying, or the like.

A coating with a dry thickness of about 0.05 to 2.5 micrometers may be obtained by single application, and a coating with a dry thickness of about 0.1 to 5.0 micrometers may be obtained by double application. The coating is then dried at an ordinary temperature or dried by heating at usually 80 to 600° C., preferably 30 to 500° C., and still more preferably 60 to 430° C. for about 5 to 240 minutes to form a glass-like or high-molecular-weight polymer coating.

As the heating means, a hot plate, oven, furnace, or the like may be used. The coating may be heated in air, nitrogen, or argon, under vacuum, or under reduced pressure in which the oxygen concentration is controlled, for example.

In order to control the curing speed of the coating, the coating may be heated stepwise, or the atmosphere may be selected from nitrogen, air, oxygen, reduced pressure, and the like, if necessary.

In this embodiment, the film-forming composition may be applied to a substrate and heated at 25 to 500° C. and preferably 30 to 450° C., and still more preferably 60 to 430° C. while applying high energy rays.

The high energy rays may be at least one type of high energy rays selected from electron beams, ultraviolet rays, and X-rays. The irradiation conditions when using electron beams are given below.

When curing the coating by applying high energy rays, the period of time required to cure the coating can be reduced in comparison with the case of curing the coating by applying heat. Therefore, when applying this method to formation of an interlayer dielectric for semiconductor devices, the processing time can be reduced even if single-wafer processing is performed.

The following description provides the irradiation conditions when using electron beams as the high energy rays.

The energy of electron beams is 0.1 to 50 keV, and preferably 1 to 30 keV, and the dose of electron beams is 1 to 1,000 microcurie/cm$^2$, and preferably 10 to 500 microcurie/cm$^2$. When the energy of electron beams is 0.1 to 50 keV, electron beams can sufficiently enter the coating without passing through the coating to damage the semiconductor element located under the coating. When the dose of electron beams is 1 to 1,000 microcurie/cm$^2$, a reaction occurs in the entire coating and damage to the coating can be reduced.

The substrate temperature during electron beam irradiation is preferably 300 to 500° C., and still more preferably 350 to 420° C. If the substrate temperature is less than 300° C., the coating may not be sufficiently cured. If the substrate temperature is greater than 500° C., the coating may be partially decomposed.

The coating may be thermally cured by heating the substrate at 250 to 500° C. before applying electron beams, and electron beams may be applied to the thermally cured coating. This method can reduce nonuniformity of the thickness caused by nonuniform electron beam application (nonuniform dose).

It is preferable to apply electron beams in an atmosphere with an oxygen concentration of 10,000 ppm or less, and preferably 1,000 ppm. If the oxygen concentration exceeds 10,000 ppm, electron beams may not effectively applied, whereby the coating may be insufficiently cured.

In this embodiment, electron beams may be applied in an inert gas atmosphere. As examples of the inert gas, $N_2$, He, Ar, Kr, and Xe (preferably He and Ar) can be given. The coating is rarely oxidized by applying electron beams in an inert gas atmosphere, whereby the dielectric constant of the resulting coating can be maintained at a low level.

Electron beams may be applied under reduced pressure. In this case, the pressure is preferably 1 to 1,000 mTorr, and still more preferably 1 to 200 mTorr.

As the high energy rays, ultraviolet rays may be used instead of electron beams. The irradiation conditions when using ultraviolet rays are as follows.

As ultraviolet rays, ultraviolet rays having a wavelength of preferably 100 to 260 nm, and still more preferably 150 to 260 nm are applied.

It is preferable to apply ultraviolet in the presence of oxygen.

The insulating film according to this embodiment of the invention includes a number of silicon-carbon bonds in the film structure. Since the polymer according to this embodiment of the invention has a polysiloxane-polycarbosilane composite structure obtained by condensing the polysiloxane compound (A) and the polycarbosilane compound (B), the polymer does not undergo phase separation, which may occur when blending a polysiloxane solution and a polycarbosilane solution, whereby a uniform film can be obtained. An insulating film which exhibits a low relative dielectric constant, excellent mechanical strength, CMP resistance, and chemical resistance can be obtained by using a film-forming composition including the polymer according to this embodiment of the invention.

Since the insulating film exhibits a low relative dielectric constant and excellent mechanical strength, CMP resistance, and chemical resistance, the insulating film is useful for applications such as an interlayer dielectric for semiconductor devices such as an LSI, system LSI, DRAM, SDRAM, RDRAM, and D-RDRAM, an etching stopper film, a protective film (e.g. surface coating film) for semiconductor devices, an intermediate layer used in the semiconductor manufacturing process using a multilayer resist, an interlayer dielectric for multilayer wiring boards, and a protective film or an insulating film for liquid crystal display devices.

4. EXAMPLES

The invention is described below in more detail by way of examples. Note that the invention is not limited to the following examples. In the examples and comparative examples, "part" and "%" respectively refer to "part by weight" and "wt %" unless otherwise indicated.

4.1. Evaluation Method

Each item was evaluated as follows.
4.1.1. Relative Dielectric Constant

An aluminum electrode pattern was formed on the resulting polymer film by deposition to prepare a relative dielectric constant measurement sample. The relative dielectric constant of the polymer film was measured at room temperature by a CV method at a frequency of 100 kHz using an electrode "HP 16451B" and a precision LCR meter "HP4284A" manufactured by Yokogawa-Hewlett-Packard, Ltd.
4.1.2. Chemical Resistance An 8-inch wafer on which the polymer film was formed was immersed in a 0.2% diluted hydrofluoric acid aqueous solution at room temperature for one minute, and a change in the thickness of the polymer film before and after immersion was determined. A polymer film having a residual film rate (defined below) of 99% or more was determined to exhibit excellent chemical resistance ("A" in Table 1), and a polymer film having a residual film rate of less than 99% was determined to exhibit poor chemical resistance ("B" in Table 1).

Residual film rate(%)=(thickness after immersion)/(thickness before immersion)×100

4.2. Synthesis Example 1

15 g of methyltrimethoxysilane (7.4 g as complete hydrolysis-condensation product), 20 g of tetraethoxysilane (5.8 g as complete hydrolysis-condensation product), and 15 g of bis(hexamethoxysilyl)methane (6.9 g as complete hydrolysis-condensation product) were added to a mixed solution of 5 g of 25% aqueous ammonia, 320 g of ultrapure water, and 600 g of ethanol. The mixture was then allowed to react at 60° C. for three hours. After the addition of 200 g of propylene glycol monopropyl ether, the mixture was concentrated under reduced pressure until the total amount of the solution was reduced to 140 g. Then, 10 g of a 10% propylene glycol monopropyl ether solution of acetic acid was added to obtain a solution (A-1) with a solid content of 13.0%.

4.3. Example 1

1.5 g of commercially available polycarbosilane having a weight average molecular weight of 1,000 ("NIPUSI Type-S" manufactured by Nippon Carbon Co., Ltd.; carbosilane polymer of polydimethylsilane) was added to a mixed solution of 150 g of the solution (A-1) synthesized in Synthesis Example 1 (propylene glycol monopropyl ether solution of polysiloxane with a solid content of 13.0%), 5 g of 25% aqueous ammonia, 320 g of ultrapure water, and 600 g of ethanol. The mixture was then allowed to react at 60° C. for five hours. After the addition of 1,000 g of propylene glycol monopropyl ether, the mixture was concentrated under reduced pressure until the total amount of the solution was reduced to 160 g. Then, 10 g of a 10% propylene glycol monopropyl ether solution of acetic acid was added to obtain a insulating-film-forming composition (A-2) with a solid content of 12.3%.

4.4. Example 2

1.5 g of commercially available polycarbosilane having a weight average molecular weight of 5,000 ("NIPUSI Type-S" manufactured by Nippon Carbon Co., Ltd.; carbosilane polymer of polydimethylsilane) was added to a mixed solution of 150 g of the solution (A-1) synthesized in Synthesis Example 1 (propylene glycol monopropyl ether solution of polysiloxane with a solid content of 13.0%), 5 g of 25% aqueous ammonia, 320 g of ultrapure water, and 600 g of isopropyl alcohol. The mixture was then allowed to react at 60° C. for five hours. After the addition of 1,000 g of propylene glycol monopropyl ether, the mixture was concentrated under reduced pressure until the total amount of the solution was reduced to 160 g. Then, 10 g of a 10% propylene glycol monopropyl ether solution of acetic acid was added to obtain an insulating-film-forming composition (A-3) with a solid content of 12.3%.

4.5. Example 3

1.5 g of commercially available polycarbosilane having a weight average molecular weight of 1,000 ("NIPUSI Type-S" manufactured by Nippon Carbon Co., Ltd.; carbosilane polymer of polydimethylsilane) was added to a mixed solution of 150 g of the solution (A-1) synthesized in Synthesis Example 1 (propylene glycol monopropyl ether solution of polysiloxane with a solid content of 13.0%), 5 g of a 25% hydrochloric acid, 320 g of ultrapure water, and 600 g of ethanol. The mixture was then allowed to react at 60° C. for five hours. After the addition of 1,000 g of propylene glycol monopropyl ether, the mixture was concentrated under reduced pressure until the total amount of the solution was reduced to 160 g. Then, 10 g of a 10% propylene glycol monopropyl ether solution of acetic acid was added to obtain an insulating-film-forming composition (A-4) with a solid content of 12.3%.

4.6. Test Example 1

Each of the composition (A-2) obtained in Example 1, the composition (A-3) obtained in Example 2, the composition (A-4) obtained in Example 3, and the solution (A-1) obtained in Synthesis Example 1 was applied to an 8-inch silicon wafer by spin coating. The applied composition (solution) was heated at 80° C. for five minutes in air, at 200° C. for five minutes in nitrogen, at 340° C., 360° C., and 380° C. for 30 minutes, respectively, under vacuum, and at 425° C. for one hour under vacuum to form a transparent colorless coating. The relative dielectric constant and the chemical resistance of the coating were measured according to the evaluation methods described in "4.1. Evaluation method". The results are shown in Table 1.

In Table 1, Experimental Examples 1 to 3 respectively indicate the results obtained when using the solutions (A-2), (A-3), and (A-4) prepared in Examples 1 to 3, and Comparative Example 1 indicates the results obtained when using the solution (A-1) prepared in Synthesis Example 1.

4.7. Test Example 2

Each of the composition (A-2) obtained in Example 1, the composition (A-3) obtained in Example 2, the composition (A-4) obtained in Example 3, and the solution (A-1) obtained in Synthesis Example 1 was applied to an 8-inch silicon wafer by spin coating to obtain a coating with a thickness of 0.5 micrometers. The coating was heated at 80° C. for five minutes in air and at 200° C. for five minutes in nitrogen. Then, electron beams were applied to the coating in a helium (He) atmosphere at an acceleration voltage of 5 keV, a hot plate temperature of 400° C., and a pressure of 1.33 Pa to form an insulating film. The relative dielectric constant and the chemical resistance of the insulating film were measured according to the evaluation methods described in "4.1. Evaluation method". The results are shown in Table 1.

In Table 1, Experimental Examples 4 to 6 respectively indicate the results obtained in Test Example 2 when using the solutions (A-2), (A-3), and (A-4) prepared in Examples 1 to 3, and Comparative Example 2 indicates the results obtained in Test Example 2 when using the solution (A-1) prepared in Synthesis Example 1.

TABLE 1

| | Relative dielectric constant | Chemical resistance |
|---|---|---|
| Experimental Example 1 | 2.2 | A |
| Experimental Example 2 | 2.2 | A |
| Experimental Example 3 | 2.3 | A |
| Experimental Example 4 | 2.3 | A |
| Experimental Example 5 | 2.3 | A |
| Experimental Example 6 | 2.4 | A |
| Comparative Example 1 | 2.2 | B |
| Comparative Example 2 | 2.3 | B |

As is clear from Table 1, it was confirmed that the insulating films obtained in Experimental Examples 1 to 6 exhibited a low relative dielectric constant and excellent chemical resistance in comparison with the insulating films obtained in Comparative Examples 1 and 2 in which the composition containing only the polysiloxane was used (i.e. the polycarbosilane was not used).

What is claimed is:

1. A process for producing a polymer, comprising mixing (A) a polysiloxane compound and (B) a polycarbosilane compound in the presence of a catalyst, water, and an organic solvent, and heating the mixture:

wherein the polycarbosilane compound (B) is a polycarbosilane compound having a structure of the following general formula (1),

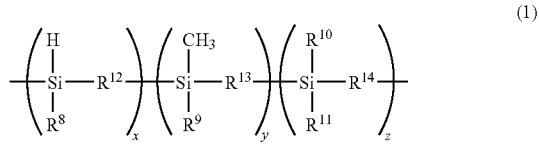

wherein, $R^8$ represents a group selected from the group consisting of a hydrogen atom, a halogen atom, a hydroxyl group, an alkoxy group, an acyloxyl group, a sulfone group, a methanesulfone group, a trifluoromethanesulfone group, an alkyl group, an alkenyl group, and an aryl group, $R^9$ represents a group selected from the group consisting of a halogen atom, a hydroxyl group, an alkoxy group, an acyloxyl group, a sulfone group, a methanesulfone group, a trifluoromethanesulfone group, an alkyl group, an alkenyl group, and an aryl group, $R^{10}$ and $R^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an alkenyl group, and an aryl group, $R^{12}$ to $R^{14}$ individually represent a substituted or unsubstituted methylene group, a substituted or unsubstituted alkylene group, a substituted or unsubstituted alkenylene group, or a substituted or unsubstituted arylene group, and x, y, and z individually represent integers from 0 to 10,000 which satisfy "5<x+y+z<10,000", provided that, when "x=0", one of $R^9$, $R^{10}$, and $R^{11}$ is a hydrogen atom, a hydroxyl group, an alkoxy group, an acyloxyl group, a sulfone group, a methanesulfone group, or a trifluoromethanesulfone group, and wherein the polycarbosilane compound (B) additionally contains at least one of the following structural units (5) to (7):

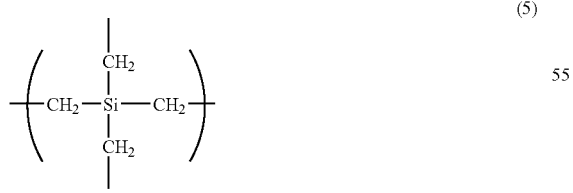

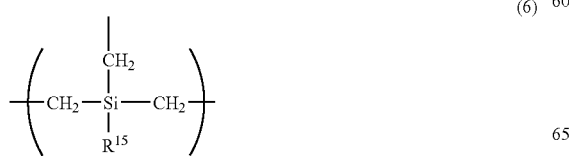

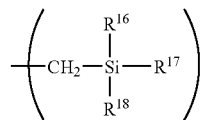

wherein $R^{15}$ to $R^{18}$ individually represents a group selected from the group consisting of a hydrogen atom, a halogen atom, a hydroxyl group, an alkoxy group, an acyloxyl group, a sulfone group, a methanesulfone group, and a trifluoromethanesulfone group, whereby polysiloxane compound (A) and polycarbosilane compound (B) are hydrolyzed and condensed, thereby forming said polymer.

2. The process according to claim 1, wherein the component (A) is obtained by hydrolyzing and condensing a hydrolyzable-group-containing silane compound, and the component (B) is used in an amount of 1 to 1,000 parts by weight for 100 parts by weight of the component (A) as a complete hydrolysis-condensation product.

3. The process according to claim 1, wherein the component (B) has a polystyrene-reduced weight average molecular weight of 400 to 50,000.

4. The process according to claim 1, wherein the catalyst is an acid catalyst, a base catalyst, or a metal catalyst.

5. The process according to claim 1, wherein the catalyst is used in an amount of 0.001 to 100 parts by weight for 100 parts by weight of the component (A) and the component (B) in total.

6. The process according to claim 1, wherein the water is used in an amount of 0.1 to 100 parts by weight for 100 parts by weight of the component (A) and the component (B) in total.

7. A polymer obtained by the process according to claim 1.

8. An insulating-film-forming composition, comprising the polymer according to claim 7 and an organic solvent.

9. A method of forming an insulating film, comprising applying the insulating-film-forming composition according to claim 8 to a substrate, and heating the applied composition at 30 to 500° C.

10. An insulating film obtained by the method according to claim 9.

11. The process according to claim 1, wherein polysiloxane compound (A) is obtained by hydrolyzing and condensing at least one silane compound selected from the group consisting of a compound of the following general formula (2), a compound of the following general formula (3), and a compound of the following general formula (4):

$$R_a Si(OR^1)_{4-a} \quad (2)$$

wherein R represents a hydrogen atom, a fluorine atom, or a monovalent organic group, $R^1$ represents a monovalent organic group, and a represents an integer from 1 to 3, $$Si(OR^2)_4 \quad (3)$$

wherein $R^2$ represents a monovalent organic group, $$R^3{}_b(R^4O)_{3-b}Si-(R^7)_d-Si(OR^5)_{3-c}R^6{}_c \quad (4)$$

wherein $R^3$ to $R^6$ individually represent monovalent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1.

12. The process according to claim 1, wherein x, y, and z are respectively $0 \leq x \leq 800$, $0 \leq y \leq 500$, and $0 \leq z \leq 1,000$.

13. The process according to claim 1, wherein x, y, and z are respectively $0 \leq x \leq 500$, $0 \leq y \leq 300$, and $0 \leq z \leq 500$.

14. The process according to claim 1, wherein x, y, and z are respectively $0 \leq x \leq 100$, $0 \leq y \leq 50$, and $0 \leq z \leq 100$.

15. The process according to claim 1, wherein the catalyst is an acid catalyst.

16. The process according to claim 1, wherein the catalyst is a base catalyst.

17. The process according to claim 1, wherein the catalyst is a metal catalyst.

* * * * *